（12）United States Patent
Ma

(10) Patent No.: US 6,985,389 B2
(45) Date of Patent: Jan. 10, 2006

(54) PHASE CHANGE BASED MEMORY DEVICE AND METHOD FOR OPERATING SAME

(75) Inventor: Herman Ma, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/695,238

(22) Filed: Oct. 27, 2003

(65) Prior Publication Data

US 2005/0088872 A1 Apr. 28, 2005

(51) Int. Cl.
*G11C 7/00* (2006.01)

(52) U.S. Cl. .................................. 365/189.07; 365/207

(58) Field of Classification Search ............ 365/189.07, 365/210, 189.01, 189.09, 196, 207

See application file for complete search history.

(56) References Cited

U.S. PATENT DOCUMENTS 6,809,976 B2 * 10/2004 Ooishi ........................ 365/210

* cited by examiner

*Primary Examiner*—Thong Q. Le
(74) *Attorney, Agent, or Firm*—Lisa K. Jorgenson; Andre M. Szuwalski

(57) ABSTRACT

A circuit and method are disclosed for a memory device, such as a phase change memory. Specifically, there is disclosed a memory having a plurality of columns of memory cells, with each column of memory cells being coupled to a bit or data line. Each memory cell includes a programmable resistive element coupled in series with a select transistor. Each bit line is coupled to a distinct reference cell and a distinct transistor. The transistor is coupled between the corresponding bit line and a reference voltage, such as ground. During a memory read operation, the transistor, reference cell and addressed memory cell form a differential amplifier circuit. The output of the differential amplifier circuit is coupled to the data output terminals of the phase change memory.

35 Claims, 2 Drawing Sheets

PHASE CHANGE BASED MEMORY DEVICE AND METHOD FOR OPERATING SAME

BACKGROUND OF THE INVENTION

1. Technical Field of the Invention

The present invention relates to a semiconductor memory device, and particularly to a semiconductor memory device utilizing phase change material.

2. Description of the Related Art

Memory devices have been in existence for decades to store data or other information. There are presently many different types of both volatile and nonvolatile memories. One type of nonvolatile memory is a phase change memory. Phase change memories utilize phase change materials. Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered molecular or atomic structure. Generally, any phase change material may be utilized. In some embodiments, however, thin-film chalcogenide alloy materials may be particularly suitable.

The phase change of phase change material may be reversible. Therefore, phase change material in a phase change memory may change from the amorphous to the crystalline state and may revert back to the amorphous state thereafter, or vice versa, in response to certain changes.

In effect, each memory cell may be thought of as a programmable resistor, which reversibly changes between higher and lower resistance states.

In some embodiments, the phase change memory cell may be configured in any of a relatively large number of states. That is, because each state may be distinguished by a distinct resistance or resistance range, a number of resistance-determined states may be possible, thereby allowing for the storage of multiple bits of data in a single phase change memory cell.

A variety of phase change alloys are known. Generally, chalcogenide alloys contain one or more elements from Column VI of the periodic table.

Phase change materials in phase change memories may be programmed from a relatively low resistance (crystalline) state to a relatively high resistance (amorphous) state by applying to the phase change material being programmed a pulse of current having a voltage level greater than a switching threshold voltage of the phase change material. Programming the phase change materials from the relatively high resistance state to the relatively low resistance state is performed by applying to the phase change material a pulse of current of a lesser current level, but also at a voltage greater than the switching threshold of the phase change material.

In the semiconductor industry, there is an ongoing demand for integrated circuits that are smaller, faster and less expensive to manufacture. Based upon the foregoing, there is a need for memories, such as phase change memories, having improved performance.

SUMMARY OF THE INVENTION

Exemplary embodiments of the present invention overcome shortcomings with prior phase change memory devices and satisfy a significant need for a phase change memory device that is relatively fast and is less sensitive to variations in electrical operating characteristics. The phase change memory device may include an array of phase change memory cells arranged in rows and columns, with each column of memory cells being coupled to a distinct bit line. The memory device may include a reference cell coupled to a first bit line of the bit lines, and a transistor coupled between the first bit line and a reference voltage level.

Address decode circuitry selects a row of memory cells corresponding to an address value received by the phase change memory device. An addressed memory cell in the column of memory cells coupled to the first bit line, the reference cell and the transistor form a differential amplifier circuit to relatively quickly provide a data value stored in the addressed memory cell to a data output terminal of the phase change memory device. Because of the differential amplifier circuit structure, sense amplifiers and memory precharge operations are not necessary.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
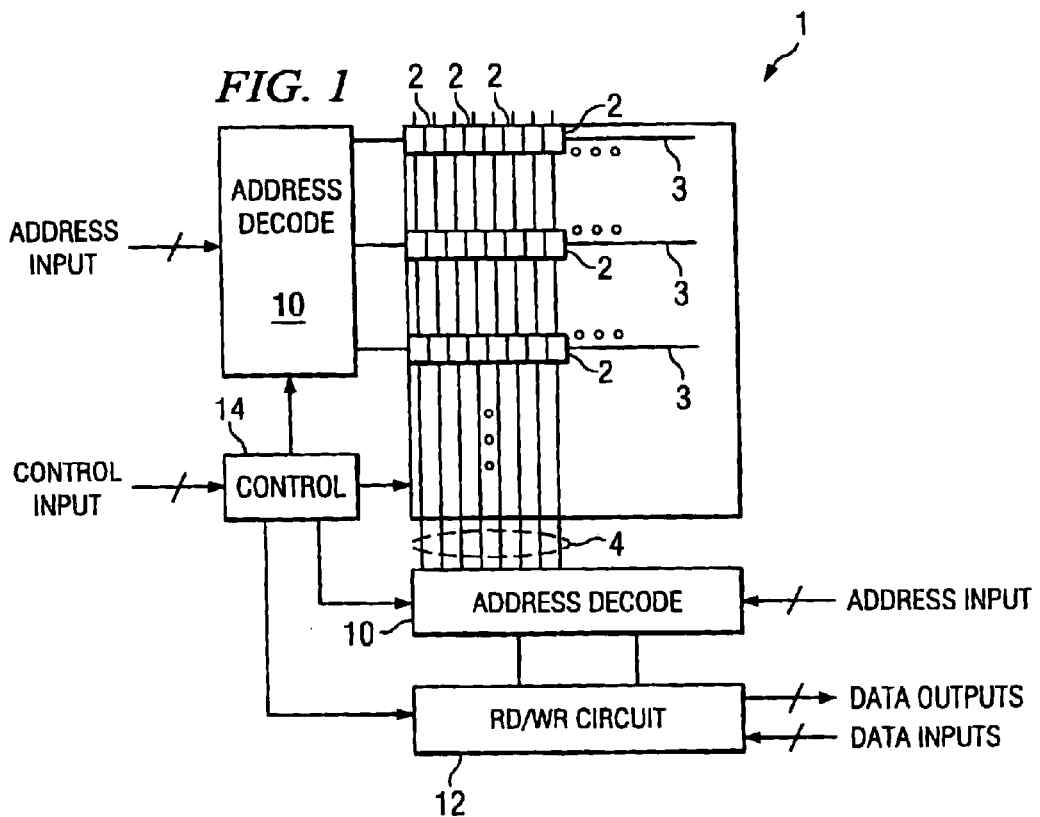
FIG. 1 is a block diagram of a memory device according to an exemplary embodiment of the present invention.
Figure 2:
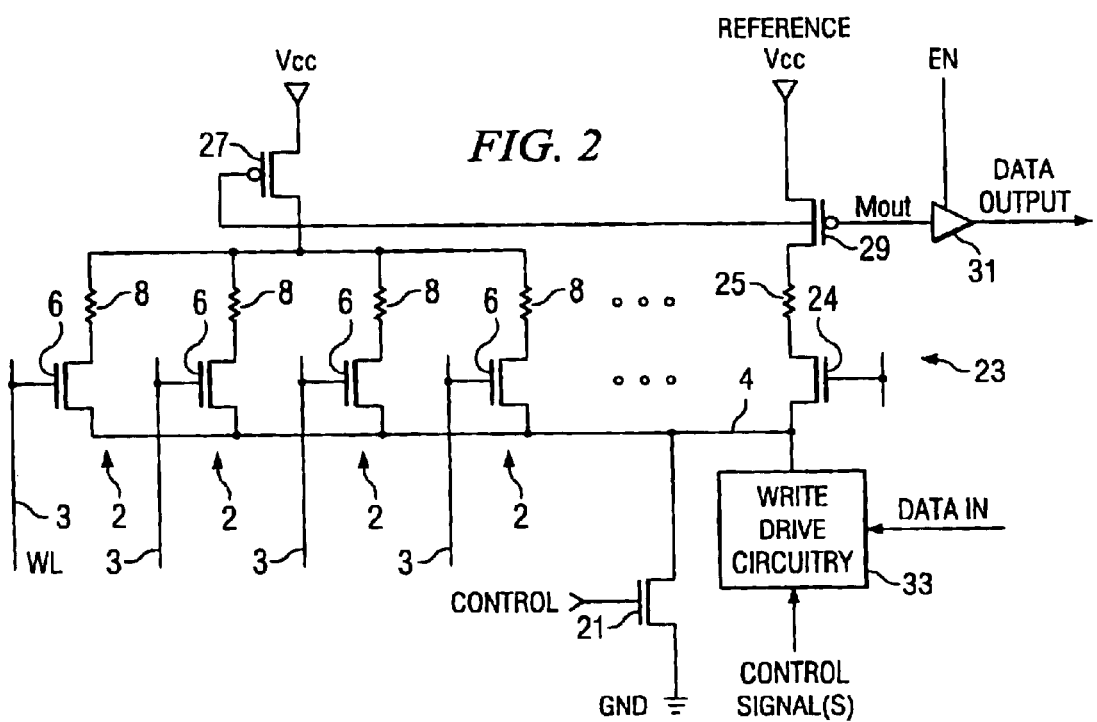
FIG. 2 is a schematic of a portion of the memory device of FIG. 1.

Referring to FIGS. 1 and 2, there is shown a memory device 1 according to an exemplary embodiment of the present invention. Memory device 1 may include an array of memory cells 2 arranged into rows and columns. Each row of memory cells 2 may be coupled to a distinct word line 3, and each column of memory cells may be coupled to a distinct bit or data line 4. Each memory cell 2 may include a select transistor 6 and a programmable (or programmed) resistive element 8 coupled in series therewith (FIG. 2). Select transistor 6 may be a field effect transistor as illustrated in FIG. 2, but it is understood that select transistor 6 may be another type of transistor, such as a bipolar transistor. Resistive element 8 may be electrically programmable or programmed and be formed of a chalcogenide composition. It is understood that resistive elements 8 may have a different composition and/or structure that allows for programmability, particularly electrical programmability.

Memory device 1 may further include address decode circuitry 10 for receiving an address value and selecting a row of memory cells 2 based upon the received address value. Address decode circuitry 10 may drive the word line 3 corresponding to the received address value to a first voltage level that activates the select transistors 6 of memory cells 2 in the addressed row, and drive the other word lines 3 to a second voltage level that deactivates the select transistors 6 of memory cells 2 in the rows not addressed. Further, address decode circuitry 10 may include circuitry that couples one or more bit lines 4 corresponding to the received address value to the data input and/or data output terminals of memory device 1. For example, address decode circuitry 10 may include multiplexing circuitry for coupling a bit line 4 to a data input and/or data output terminal of memory device 1. The particular implementation of address decoding circuitry 10 is known in the art and will not be described in greater detail for reasons of simplicity.

Memory device 1 may further include read/write drive circuitry 12 coupled to bit lines 4 and/or address decode circuitry 10, for providing to addressed memory cells 2 data values appearing at the data input terminals of memory device 1, and for providing to data output terminals of memory device 1 data values stored in addressed memory cells 2.

A control circuit 14 may be coupled to the array of memory cells 2, address decode circuitry 10, and read/write drive circuitry 12 and include timing and logic circuitry for generating timing and/or control signals for executing memory read and memory write operations.

As stated above, each memory cell 2 may include a select transistor 6 and a programmable resistive element 8 coupled in series therewith. FIG. 2 illustrates a portion of the array of memory cells 2 and its interrelationship with other circuitry in memory device 1. Specifically, FIG. 2 shows a column of memory cells 2 with each memory cell 2 in the column being coupled to a different word line 3 (in FIG. 2, the column of memory cells 2 has been rotated 90 degrees for clarity purposes). Each memory cell 2 may include a resistive element 8 connected in series with a select transistor 6. The select transistor 6 of each memory cell may be coupled between the bit line 4 and the corresponding resistive element 8.

Each bit line 4 may be coupled to a transistor 21. Each transistor 21 may have a first conduction (drain) terminal coupled to a bit line 4, a second (source) terminal coupled to a reference voltage level, such as ground, and a control terminal. The control terminal of transistors 21 may be driven by a control signal generated by control circuit 14 so that transistors 21 are activated (i.e., turned on) during a memory read operation and deactivated (turned off) during a memory write operation. Each bit line 4 is coupled to a reference cell 23. Reference cell 23 may include a select transistor 24 connected in series with a resistive element 25. Select transistor 24 may be coupled between resistive element 25 and the corresponding bit line 4. The control terminal of select transistor 24 may be coupled to an output of read/write circuitry 12 or control circuit 14 so that select transistor 25 may be activated during a memory read operation and is deactivated during a memory write operation.

Resistive element 25 of reference cell 23 may have a certain resistance value that is between the possible resistance values of resistive elements 8. Resistive element 25 may be, for example, programmable or programmed and constructed from a composition from which resistive elements 8 are constructed, such as from a chalcogenide composition. Alternatively, resistive element 25 may have a different structure or composition.

Memory device 1, and particularly the array of memory cells 2, may include a plurality of load elements. Referring again to FIG. 2, each column of memory cells may be coupled to a first load element 27. Specifically, each load element 27 may be a diode-connected transistor, such as a p-channel transistor, and be coupled between the memory cells 2 in the column and a second reference voltage level Vcc. Each reference cell 23 may be coupled to a second load element 29. Each load element 29 may be a transistor coupled between the second reference voltage level Vcc and the corresponding reference cell 23. The control (gate) terminal of second load element 29 may be coupled to the control (gate) terminal of first load transistor 27. In this way, each bit line 4 may be associated with a distinct pair of first and second load elements. It is understood that load elements 27 and 29 may have a different structure.

According to the exemplary embodiment of the present invention, an addressed memory cell 2 serves to form part of a differential amplifier circuit during a read operation. In particular, the addressed memory cell 2, transistor 21 and reference cell 23 form a differential amplifier circuit with first load element 27 and second load element 29 during a memory read operation. Transistor 21 serves as the current source for the differential amplifier circuit. The output of the differential amplifier circuit may be taken, for example, at the node connecting second load element 29 to resistive element 25 of reference cell 23. The difference in resistance values between the resistive element 8 of the addressed memory cell 2 and the resistive element 25 of the reference cell 23 determines the voltage level appearing at the output of the differential amplifier. The operation of the differential amplifier circuit will be described in greater detail below.

The formation of a differential amplifier circuit during a memory read operation from the above-identified elements advantageously improves speed (i.e., shorter read access times). In addition, the formed differential amplifier is relatively less sensitive to resistance value variations of resistive elements 8 and 25. Further, the differential amplifier formed by transistor 21 is relatively less sensitive to variations in bias current levels. Still further, the differential amplifier structure renders precharge operations at the beginning of a conventional memory access operation unnecessary. Moreover, the memory architecture described above is relatively low power and consumes little current.

As stated above, read/write drive circuitry 12 may provide to data output terminals of memory device 1 data values stored in addressed memory cells 2 during memory read operations, and provide to addressed memory cells 2 data appearing at data input terminals of memory device 1 during memory write operations. Read/write drive circuitry 12 may include read drive circuitry 31 having an input coupled to the output of the above-described differential amplifier circuit, and an output coupled to the data output terminals of memory device 1. Read drive circuitry 31 may be designed so that the input switching threshold voltage thereof is between the two (or more) possible output voltage levels of the differential amplifier circuit. For example, the input switching threshold voltage of read drive circuitry 31 may be between a first voltage level appearing at the differential amplifier output corresponding to a logic high data value being stored in the addressed memory cell 2, and a second voltage level appearing at the output corresponding to a logic low data value stored in the addressed memory cell 2. Read drive circuitry 31 may receive a control signal from control circuit 14 and/or address decode circuitry 10 so that data values are placed upon the data output terminals of memory device 1 at certain times, such as towards the end of a memory read operation. It is understood that read drive circuitry 31 may have any of a number of different circuit implementations.

The read/write drive circuitry 12 may further include write drive circuitry 33 having an inputs coupled to the data input pins of memory device 1 and an outputs coupled to bit lines 4 associated with addressed memory cells 2. During a memory write operation, write drive circuitry 33 may receive the data value(s) to be stored in memory device 1, and drive the bit line(s) 4 associated with addressed memory cell(s) 2 to a voltage level corresponding to the data value(s). With a bit line 4 having a predetermined voltage level applied thereto, and noting the coupling of the addressed memory cells 2 to the second reference voltage level Vcc, a predetermined voltage appears across and a predetermined current flows through the resistive element 8 of the addressed memory cell 2 sufficient to cause the state of resistive element 8 to be in the state having the desired resistance value. Write drive circuitry 33 may include circuitry for driving bit lines 4 to any of a number of different voltage levels for programming resistive elements 8 to any of a number of different resistance values.

Figure 3:
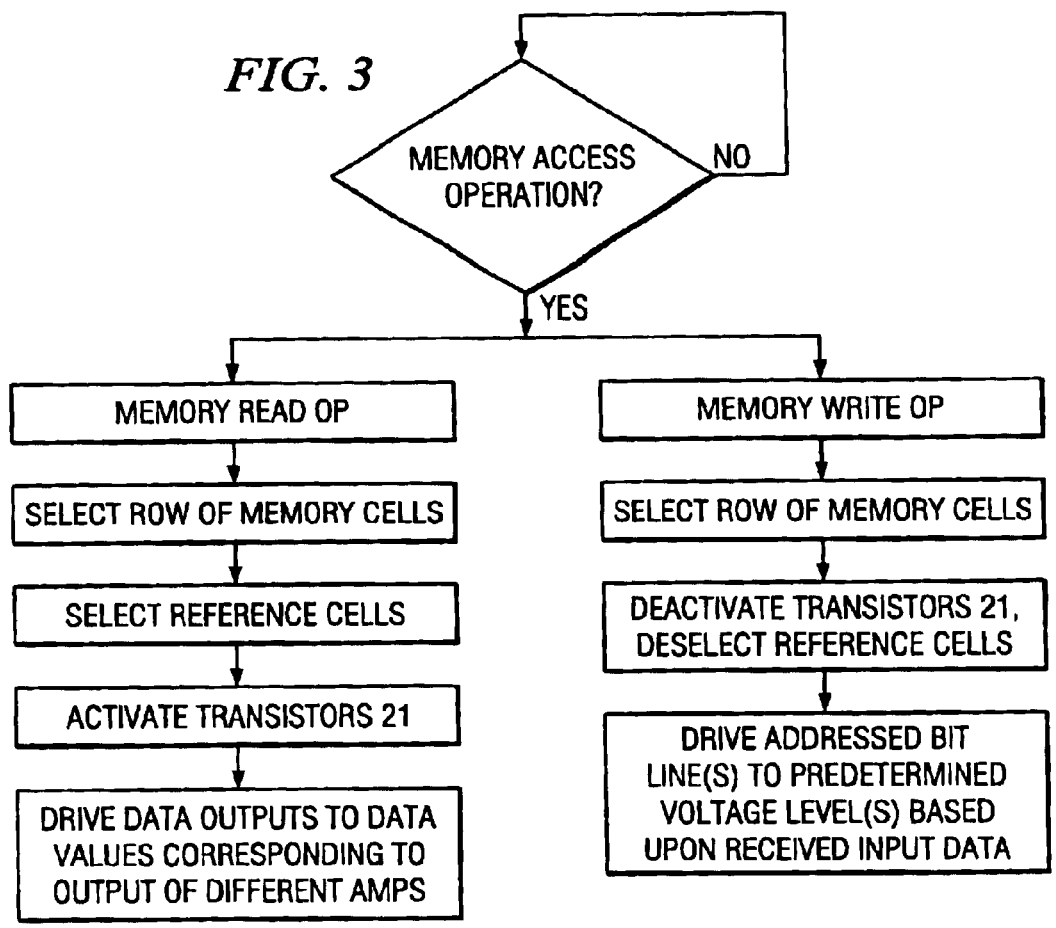
FIG. 3 is a flow chart illustrating an operation of the memory device of FIG. 1.

The operation of memory device 1 will be described with reference to FIG. 3. It is understood that the steps illustrated in FIG. 3 are not limited to the particular order shown. It is further understood that at least some of the steps illustrated in FIG. 3 may occur substantially simultaneously.

In performing a memory read operation, an address is provided to memory device 1 along with necessary control signals (RD/WR, CE, etc.). In response, memory device 1 selects a word line 3 corresponding to the received address, by driving the word line 3 to a voltage to activate select transistors 6 of memory cells 2 coupled thereto, while driving the other word lines 3 to a second voltage level to deactivate select transistors 6 of memory cells 2 in other rows. Select transistors 24 of reference cells 23 are also similarly activated and deactivated. Around this time, transistors 21 are activated. Each transistor 21 may be activated, or alternatively only those transistors 21 coupled to addressed memory cells 2 are activated.

At this point, a differential amplifier circuit is formed for each column corresponding to an addressed memory cell 2. Each differential amplifier circuit is formed by the memory cell 2 in the addressed row, transistor 21 and reference cell 23, along with first load element 27 and second load element 29. For each differential amplifier circuit, the voltage appearing and its output will be based upon the resistance value of resistive element 8 in the addressed memory cell 2. In the event the resistance value of resistive element 8 had been previously programmed to be greater than the resistance value of resistive element 25 in the corresponding reference cell 23, more current passes through second load element 29 and reference cell 23, resulting in the voltage at the output of the differential amplifier circuit being at a relatively low voltage level. Conversely, in the event the resistance value of resistive element 8 had been previously programmed to be less than the resistive value of resistive element 25 of the corresponding reference cell 23, less current passes through second load element 29 and reference cell 23, resulting in the voltage appearing at the output of the differential amplifier circuit being at a relatively high voltage level. Read drive circuitry 31 receives the output of the differential amplifier circuit and drives a data output terminal of memory device 1 to a logic level corresponding to the output voltage of the differential amplifier circuit.

In performing a memory write operation, address and data values are provided to memory device 1 along with necessary control signals (RD/WR, CE, etc.). In response, memory device 1 selects a word line 3 corresponding to the received address, by driving the word line 3 to a voltage to activate select transistors 6 of memory cells 2 coupled thereto, while driving the other word lines 3 to a second voltage level to deactivate select transistors 6 of memory cells 2 in other rows. Both transistor(s) 21 and select transistor 24 of reference cell(s) 23 are deactivated during the memory write operation. Next, write drive circuitry 33 may drive each bit line 4 associated with the received address to a predetermined voltage level that corresponds to the data value to be stored. With bit line 4 being at the predetermined voltage level, a predetermined voltage is applied across and a predetermined current flows through resistive element 8 of the addressed memory cell 2 such that resistive element 8 is placed in (or remains in) the desired state. For example, resistive element 8, being a chalcogenide resistive element, may be placed in the amorphous state or the crystalline state. In the event each memory cell 2 is capable of storing more than two different bit values, resistive elements 8 may be placed in a plurality of different amorphous and crystalline states, with each such state corresponding to a distinct resistance value (or range thereof). The particular state of resistive element 8 determines the resistance thereof. Once resistive element 8 of the addressed memory cell(s) 2 is placed in the desired state, write drive circuitry 33 may remove the voltage appearing on bit line(s) 4. At this point, the addressed memory cell(s) 2 have been written as desired.

It has been observed that memory cells 2 may be written to more effectively by, prior to or at the beginning of each memory write operation, initially placing by write drive circuitry 33 an intermediate voltage on the appropriate bit lines 4 while the select transistors 6 of addressed memory cells 2 are activated. The intermediate voltage may be between the voltage level necessary to be placed on bit line 4 to program a logic high value, and the voltage level necessary to be placed on bit line 4 to program a logic low value. Thereafter, write drive circuitry 33 may place onto the bit lines 4 corresponding to the addressed memory cells 2 voltage levels corresponding to the desired data values to be stored in the addressed memory cells 2.

Figure 4:
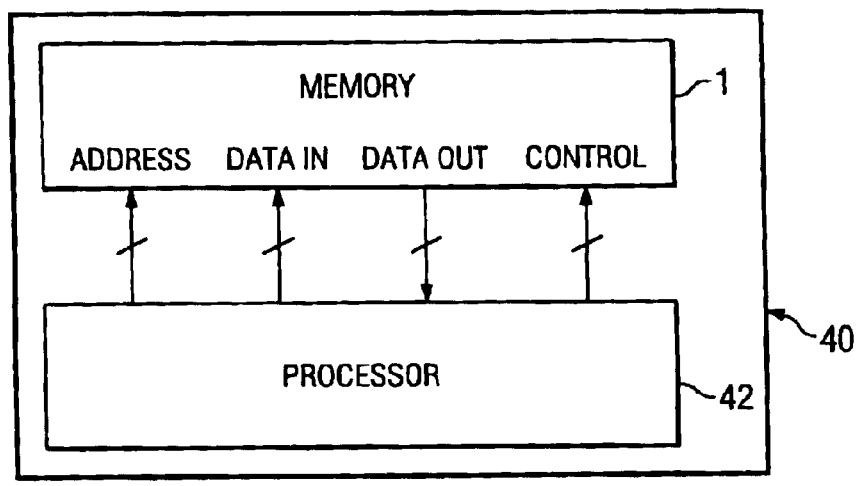
FIG. 4 is a block diagram of an electronics apparatus or system including the memory device of FIG. 1.

It is understood that memory device 1 may be included in many different electronics devices or systems. FIG. 4 shows a block diagram of an apparatus or system 40 having therein memory device 1. Apparatus 40 may be a communications device, such as a hand-held wireless telephone, a computer, etc. Apparatus 40 may include a processing element 42 having address output terminals coupled to address input terminals of memory device 1, data output terminals coupled to data input terminals of memory device 1 and data input terminals coupled to data output terminals of memory device 1. Control signals may be provided to memory device 1 by processing element 42 or a memory controller (not shown) for controlling execution of memory access operations.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory device, comprising:
   an array of memory cells arranged in row and columns, each memory cell comprising a select transistor and an electrically programmable resistive element coupled in series therewith, each column of memory cells being coupled to a bit line, each row of memory cells being coupled to a word line, the select transistor in each memory cell having a control terminal coupled to a corresponding word line;

address circuitry for receiving an address value and driving a word line corresponding thereto to a voltage level to activate select transistors of memory cells coupled to the word line corresponding to the address value;

a transistor coupled between a first bit line and a first reference voltage level;

a reference cell coupled to the first bit line, comprising a select transistor and a resistive element coupled in series therewith, the reference cell, the transistor and an addressed memory cell in the column of memory cells coupled to the first bit line forming a differential amplifier circuit; and control circuitry having an output coupled to a control terminal of the transistor for activating the transistor during a memory read operation.

2. The memory device of claim 1, wherein the electrically programmable resistive element of each memory cell comprises a resistive element having a chalcogenide composition.

3. The memory device of claim 1, wherein the control circuitry deactivates the transistor during a memory write operation.

4. The memory device of claim 1, further comprising write drive circuitry coupled to the first bit line, for placing on the first bit line during a write operation a predetermined voltage level corresponding to a data value, the predetermined voltage level being one of at least two distinct voltage levels.

5. The memory device of claim 4, wherein the write drive circuitry selectively places on the first bit line a second predetermined voltage level between a first voltage level corresponding to a first data value and a second voltage level corresponding to a second data value.

6. The memory device of claim 5, wherein the write drive circuitry places the second predetermined voltage level on the first bit line prior to or at the beginning of a memory write operation.

7. The memory device of claim 1, wherein the memory device executes memory read operations without utilization of a sense amplifier.

8. The memory device of claim 1, wherein the electrically programmable resistive element in each memory cell is programmable to one of at least two distinct resistance values, and the resistive element in the reference cell has a resistance value between the at least two distinct resistance values.

9. The memory device of claim 1, further comprising a first load element coupled between a second reference voltage level and each memory cell coupled to the first bit line, and a second load element coupled between the second reference voltage level and the reference cell.

10. An electronics device, comprising:

a memory, comprising:

an array of memory cells arranged in rows and columns of memory cells, each memory cell comprising a select transistor and a programmable resistive element coupled in series therewith, each column of memory cells being coupled to a single bit line, each row of memory cells being coupled to a single word line, the select transistor in each memory cell having a control terminal coupled to a corresponding word line;

address circuitry for receiving an address value and driving a word line corresponding thereto to a voltage level to activate select transistors of memory cells coupled to the word line corresponding to the address value;

a transistor coupled between at least one bit line and a reference voltage level;

a reference cell coupled to the at least one bit line, comprising a select transistor and a resistive element coupled in series therewith;

a first load component coupled between a second reference voltage level and the memory cells in the column of memory cells coupled to the at least one bit line;

a second load component coupled between the second reference voltage level and the reference cell, the first and second load components, the reference cell, the transistor and an addressed memory cell in the column of memory cells coupled to the at least one bit line forming a differential amplifier circuit; and control circuitry having an output coupled to a control terminal of the transistor for activating the transistor during a memory read operation.

11. The electronics device of claim 10, wherein the control circuitry deactivates the transistor during a memory write operation.

12. The electronics device of claim 10, further comprising a processor coupled to address and data terminals of the memory.

13. The electronics device of claim 10, wherein the memory further comprises write circuitry coupled to the control circuitry and the at least one bit line, the write circuitry allowing for any of two or more voltage levels to be applied to the at least one bit line during a write operation, the voltage level applied to the at least one bit line corresponding to a distinct data value and causing a current to flow through the programmable resistive element in the addressed memory cell coupled to the at least one bit line so that the programmable resistive element has a resistance value corresponding to the distinct data value.

14. The electronics device of claim 13, wherein the write circuitry causes a predetermined voltage level to be applied to the at least one bit line prior to or at a beginning of a memory write operation, the predetermined voltage level applied to the at least one bit line being between a first voltage level corresponding to a first data value and a second voltage level corresponding to a second data value.

15. The electronics device of claim 10, further comprising a processing element coupled to the memory.

16. The electronics device of claim 10, wherein the resistive element of the reference cell has a resistance value between a first resistance value corresponding to a first data value and a second resistance value corresponding to a second data value, the memory cells in the memory being capable of storing the first and second data values.

17. The electronics device of claim 10, wherein the programmable resistive element in each memory cell has any of two or more resistance values, depending upon the data value stored in the memory cell.

18. The electronics device of claim 10, wherein a data output terminal of the memory is coupled to the reference cell during a memory read operation.

19. The electronics device of claim 10, wherein the memory comprises a plurality of transistors, each transistor coupled between a distinct bit line and the reference voltage level.

20. The electronics device of claim 10, wherein the memory further comprises a plurality of reference cells, each reference cell coupled to a distinct group of one or more bit lines.

21. The electronics device of claim 10, wherein the memory is free of sense amplifier circuitry.

22. The electronics device of claim 10, wherein the memory executes memory read operations without executing a precharge operations prior thereto.

23. The electronics device of claim 10, wherein the programmable resistive element of each memory cell includes a chalcogenide composition.

24. The electronics device of claim 10, wherein the memory is a phase change memory.

25. A system, comprising:
a memory, comprising:
a memory array of memory cells arranged in rows and columns, each column of memory cells connected to a bit line and each row of memory cells connected to a word line;
a transistor having a first conduction terminal coupled to at least one bit line, a second conduction terminal coupled to a first reference voltage level and a control terminal; and
a reference cell coupled to the at least one bit line, the reference cell, the transistor and an addressed memory cell in the column of memory cells coupled to the at least one bit line forming a differential amplifier circuit having an output signal coupled to a data output terminal of the memory.

26. The system of claim 25, wherein the memory comprises an address input, and the system further comprises a processing unit coupled to the address input and the data output terminal of the memory.

27. The system of claim 25, wherein each of the memory cells in the memory array comprises an electrically programmable resistive element and a select transistor coupled thereto, a control terminal of the select transistor being coupled to a corresponding bit line.

28. The system of claim 27, wherein the electrically programmable resistive element comprises a chalcogenide resistive element.

29. The system of claim 27, wherein the reference cell comprises a resistive element and a transistor coupled thereto, the resistive element of the reference cell having a resistance value between a first resistance value corresponding to a first logic value and a second resistance value corresponding to a second logic value.

30. The system of claim 27, further comprising a write drive circuit having an output coupled to the at least one bit line, the write drive circuit controlling a voltage on the at least one bit line during a memory write operation so that the electrically programmable resistive element in an addressed memory cell is subject to a current of a predetermined amount, the predetermined amount corresponding to a data value to be stored in the addressed memory cell.

31. The system of claim 25, further comprising a control circuit having an output coupled to a control terminal of the transistor, the control circuit activating the transistor during a memory read operation and deactivating the transistor during a memory write operation.

32. An integrated circuit, comprising:
a plurality of memory cells, each memory cell coupled to a data line;
a reference cell coupled to the data line;
a transistor coupled between the data line and a reference voltage; and
a circuit for selecting one memory cell at a time, wherein the selected memory cell, the reference cell, and the transistor form a differential amplifier circuit.

33. The integrated circuit of claim 32, wherein each memory cell comprises a resistive element having a chalcogenide composition.

34. The integrated circuit of claim 32, wherein each memory cell includes a programmable resistive element.

35. The integrated circuit of claim 32, wherein the memory cells form part of a phase change memory.

* * * * *